United States Patent [19]

Babinski et al.

[11] Patent Number: 5,907,475
[45] Date of Patent: *May 25, 1999

[54] CIRCUIT BOARD SYSTEM HAVING A MOUNTED BOARD AND A PLURALITY OF MOUNTING BOARDS

[75] Inventors: Thomas E. Babinski, Kenosha; Christopher J. Wieloch, Brookfield; Gerard A. Woychik, Waukesha, all of Wis.

[73] Assignee: Allen-Bradley Company, LLC, Milwaukee, Wis.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/632,979

[22] Filed: Apr. 16, 1996

[51] Int. Cl.$^6$ ........................................... H05K 7/20
[52] U.S. Cl. ........................... 361/719; 361/775; 363/141; 439/65
[58] Field of Search ............................. 174/262; 361/803, 361/744, 784, 788, 704, 707, 690, 790, 775, 717–719, 785; 439/55, 59, 62, 65, 67; 257/713, 720, 723, 724; 363/141, 144

[56] References Cited

U.S. PATENT DOCUMENTS

| | | |
|---|---|---|
| 2,995,686 | 8/1961 | Selvin ................................. 361/803 X |
| 4,998,180 | 3/1991 | McAuliffe ............................... 361/383 |
| 5,045,642 | 9/1991 | Ohta ....................................... 174/266 |
| 5,059,557 | 10/1991 | Cragon ................................... 437/208 |
| 5,306,874 | 4/1994 | Biron ...................................... 174/262 |
| 5,315,482 | 5/1994 | Tanaka ................................... 361/707 |
| 5,455,742 | 10/1995 | Phoy ....................................... 361/778 |
| 5,484,965 | 1/1996 | Woychik ................................. 174/262 |
| 5,616,888 | 4/1997 | McLaughlin . |
| 5,629,839 | 5/1997 | Woychic . |
| 5,641,944 | 6/1997 | Wieloch . |
| 5,648,892 | 7/1997 | Wieloch et al. ........................ 361/707 |
| 5,670,749 | 9/1997 | Wieloch . |
| 5,754,411 | 5/1998 | Woychic . |

*Primary Examiner*—Gerald Tolin
*Attorney, Agent, or Firm*—Joseph N. Ziebert; John M. Miller; John J. Horn

[57] ABSTRACT

A multilayer circuit board system or laminated circuit board system for use in a motor controller includes at least two motherboards, at least one power substrate circuit board, and a capacitor circuit board. The circuit boards are mounted in an aperture or trench within each mother board. The power substrate module circuit board includes a mounting area provided in a recess, window or portion of the circuit board where the circuit board is only a single layer thick. The single circuit board layer at the mounting area provides a heat conductive yet highly electrically insulated mounting area for receiving a heat sink. The heat sink can be mounted on a side opposite the electrical device. The capacitor circuit board, power substrate circuit board, and mother circuit boards are interconnected without the use of external connectors or wires. The use of two mother boards increases the rigidity of the circuit board system.

22 Claims, 9 Drawing Sheets

CIRCUIT BOARD SYSTEM HAVING A MOUNTED BOARD AND A PLURALITY OF MOUNTING BOARDS

CROSS-REFERENCE TO RELATED APPLICATIONS

The present application is related to U.S. patent application Ser. No. 08/316,667, filed Sep. 30, 1994 by Woychik, now U.S. Pat. No. 5,484,965, U.S. patent application Ser. No. 08/292,491, filed Aug. 18, 1994 by Wieloch which is a continuation of U.S. Pat. No. 5,615,087, U.S. patent application entitled, "Circuit Board Having A Window Adapted To Receive A Single In-Line Package Module," filed Sep. 12, 1995 by Woychik, now U.S. Pat. No. 5,754,411, U.S. patent application entitled, "A Module Interconnect Adapted For Reduced Parasitic Inductance," filed Sep. 12, 1995, by Woychik, now U.S. Pat. No. 5,629,839, U.S. patent application entitled, "Rigid-Flex Circuit Board Having a Window for an Insulated Mounting Area," filed by McLaughlin et al on Sep. 29, 1995, now U.S. Pat. No. 5,616,888, U.S. patent application entitled "A Multilayer Circuit Board Having A Window Exposing An Enhanced Conductive Layer For Use As An Insulated Mounting Area," filed by Wieloch et al on Sep. 29, 1995, now U.S. Pat. No. 5,670,749, U.S. patent application entitled, "A Method Of Making A Multilayer Circuit Board Having A Window Exposing An Enhanced Conductive Layer For Use As An Insulated Mounting Layer", filed by Wieloch et al on Sep. 29, 1995, abandoned for FWC Ser. No. 08/878,488 filed Jun. 18, 1997, U.S. patent application entitled, "Power Substrate With Improved Thermal Characteristics", filed by Wieloch et al on Sep. 29, 1995, now U.S. Pat. No. 5,641,944. This application is a continuation-in-part of U.S. patent application entitled, "A Wireless Circuit Board System for a Motor Controller," filed by Wieloch et al on Sep. 29, 1995, which issued on Jul. 15, 1997, as U.S. Pat. No. 5,648,892.

FIELD OF THE INVENTION

The present invention relates to a circuit board system useable in electric applications including power applications. More particularly, the present invention relates to a circuit board package configured to reduce the amount of space required for a plurality of circuit boards.

BACKGROUND OF THE INVENTION

In general, electronic applications such as high power applications including motor controllers, inverters, converters, power supplies, or other control devices often utilize a number of modules or circuit boards. For example, in the field of electronic motor controllers, it is commonplace to build a controller package as an assemblage of circuit boards which are configured to a dissipate heat associated with the power electronic components. Each of the circuit boards supports components and conducting paths for accomplishing various functions in the completed device. Typically, these boards include power modules or circuit boards which house high-power electrical devices such as resistors, rectifiers, and semiconductor switches, logic, control, or customer interface circuit boards (e.g., motherboards) which house microprocessors or other logic devices for performing control functions, and storage or capacitor circuit boards which house charge storage devices and direct current (DC) power busses.

Such motor controllers generally include circuitry for monitoring and manipulating the operation of the motor such as control logic circuitry, charge storage circuitry and power components. The control logic circuitry, typically including programmable solid state circuits such as a programmable logic controller mounted on a motherboard or a separate logic circuit module, monitors operating parameters of the motor and generates control signals for driving the motor in accordance with a preset control routine and various operator inputs. The charge storage circuitry, typically including large electrolytic power capacitors mounted on a conventional circuit board, receives rectified DC power from the power components and provides filtered DC power on power busses. The power components typically include diode rectifying circuits for receiving AC power from a source and converting it to DC power, and power transistors or similar solid state switching devices, such as insulated gate bipolar transistors (IGBTs), for converting the DC power stored in the charge storage circuitry to controlled AC signals for driving the motor based upon the control signals produced by the control circuitry.

The power components are mounted on a specialized power substrate module circuit board optimized for heat dissipation. The logic circuitry is typically mounted on a customer interface or mother circuit board, and the charge storage circuitry is mounted on a capacitor board.

These circuit board systems typically require module or circuit board interconnection systems (e.g., external wires, connectors, header assemblies, or other hardware) to interface each circuit board (e.g., the power substrate module, the customer interface board, the motherboard and capacitor board). Module interconnection systems often include pins bent at a 90° angle. First ends of the pins insert into holes in the circuit boards or modules, and the second ends of the pins are inserted into holes in the motherboard. An insulating frame is provided between the first and second ends. The frame which is located proximate the 90° bend in the pins is usually rectangularly shaped and provides a stable seat or structure between the motherboard and the module. The first and second ends of the pins are soldered to contact areas proximate the holes on the modules and the motherboard, respectively. Alternatively, module interconnection systems may include slot edge connectors, card connectors, or other printed circuit board (PCB) connectors, or the circuit boards may be interconnected with external wires, cables or connectors.

Such interconnection systems are not only expensive, bulky, and add to the cost of assembling the circuit board system, but create significant impedance matching problems in high power applications such as in motor controller applications. For example, motor controllers and high power circuits such as inverters, converters, and power supplies often must include snubbing circuits, or other resistive (R), capacitive (C), or inductive (L) networks to tune the circuit boards and reduce the parasitic inductive effects and capacitive effects associated with the circuit board interconnection systems. These parasitic inductance problems between circuit boards are amplified by the very high switching frequency and the power associated with power modules, particularly in the turnoff phase of inverter operation.

Further, the circuit board conductors and external wires associated with the power busses and signal lines are often susceptible to parasitic inductance problems due to the length and bends of the circuit board conductors and external wires as well as the limited space on the circuit boards. The limited space is typically due to the volume requirements for the circuit board system package. Therefore, there is a need for extra circuit board space in conventional circuit board system packages and an interconnection system which does not require wires.

Even further, circuit board systems often require a reinforced housing or other containers which provide structural support for the circuit board systems. Such housings often require expensive brackets, support components, and other materials for supporting the circuit board system. Thus, there is a need for a structurally rigid circuit board system which does not require substantial support from a container or housing.

Additionally, circuit board systems utilized in power applications often generate a significant amount of heat, and require heat sinks or other thermal management systems to prevent the circuit boards and electrical devices from overheating. Heat sinks are typically metal components relatively large in size and can be secured to circuit boards or associated electrical devices to enhance heat dissipation therefrom. Conventional heat sinks typically add to the cost of assembly of the circuit board system. Therefore, applications such as motor control applications require circuit board systems which are optimized for superior heat dissipation.

Thus, there is a need for a circuit board system configured to reduce the volume required for a circuit board system package. There is also a need for a low cost motor controller circuit board system optimized for heat dissipation and ease of assembly.

SUMMARY OF THE INVENTION

The present invention relates to a circuit board system including a first mounting board having a conductive pattern, at least one mounted board having a conductive pattern, and a second mounting board having a conductive pattern. The mounted board is received within the first mounted board along a first mounting edge of the mounting board at an angle less than 180° and greater than 0°, and the mounted board is also received within the second mounting board along a second mounting edge of the mounted board at an angle less than 180° and greater than 0°.

The present invention also relates to a circuit board system having a plurality of mounting boards and a mounted board. The mounting boards and mounted board each include a conductive pattern. The mounted board is received within each of the mounting boards along a plurality of mounting edges. At least one electrical connection is made between the mounting boards and the mounted board. Each of the mounting boards includes a mounting surface including a mounting feature. The mounting feature is disposed in the mounting surface of the mounting boards and is configured to receive one of the mounting edges of the mounted board.

The present invention further relates to a circuit board system including a first circuit board, a second circuit board and a third circuit board. The first circuit board has a first mounting area configured to receive the third circuit board, and the second circuit board has a second mounting area configured to receive the third circuit board. The first mounting area is configured to receive a first edge of the third circuit board within the first circuit board. The second mounting area is configured to receive a second edge of the third circuit board within the second circuit board.

The present invention still further relates to a motor controller circuit board system including a power substrate circuit board and a plurality of logic boards. Each of the logic circuit boards includes a mounting area integral within the logic circuit board which mechanically and electrically receive the power substrate circuit board.

According to one aspect of the present invention, the circuit board system is used in a motor controller package and includes at least one solderable component module (SCM™) interconnect, or board module (e.g., a mounted board), and at least two motherboards (e.g., mounting board), interface circuit boards, or logic circuit boards. The board module or board modules are mechanically and electrically coupled to each motherboard at a 90° angle. The motherboards are preferably in a parallel orientation with each other and are coupled to the top and bottom edge of the board modules. The motherboards are wave soldered to the board modules and include positive and negative DC busses. The circuit board system can be packaged in a minimal amount of space and does not require a reinforced housing because of the rigidity provided by the at least two motherboards.

In another exemplary aspect of the present invention, the DC power busses such as convertor busses and positive and negative busses are disposed on opposite sides of the motherboards and have a large width. The motherboards can include logic circuitry for motor controller applications. The motherboards may be comprised of conventional circuit board material or enhanced dielectric material.

According to an even further exemplary embodiment of the present invention, a motor controller is disposed on a compact circuit board system and does not utilize external wires or conventional connectors to couple the circuit board modules together. The present invention advantageously utilizes printed wire circuit board conductors and finger connectors to mechanically and electrically couple the circuit board modules to the motherboards. The motherboards may be configured to have slots or apertures for receiving edges of the circuit board modules. The edges of the circuit board modules preferably include finger connectors which can be soldered to mounting features on the motherboards.

BRIEF DESCRIPTION OF THE DRAWINGS

The preferred embodiments of the invention will hereinafter be described in conjunction with the appended drawings, wherein like numerals denote like elements, and.

DETAILED DESCRIPTION OF THE PREFERRED EXEMPLARY EMBODIMENTS OF THE PRESENT INVENTION

Although the following description refers to a specific application of the circuit board system in a specific motor drive which controls a three-phase motor, the invention may be more generally applicable to any circuit board system for any electronic application including but not limited to polyphase and single phase motors of various power ratings and sizes. Turning now to the drawings and referring first to FIG. 1, a motor controller or motor drive control system 13 is illustrated diagrammatically as it would be installed for driving an electric motor 12 at desired speeds. Thus installed, system 13 is coupled to phase conductors 14, 16, 18 and a ground conductor 20 via protective circuits, typically including fuses 22, 24, 26.

Figure 1:
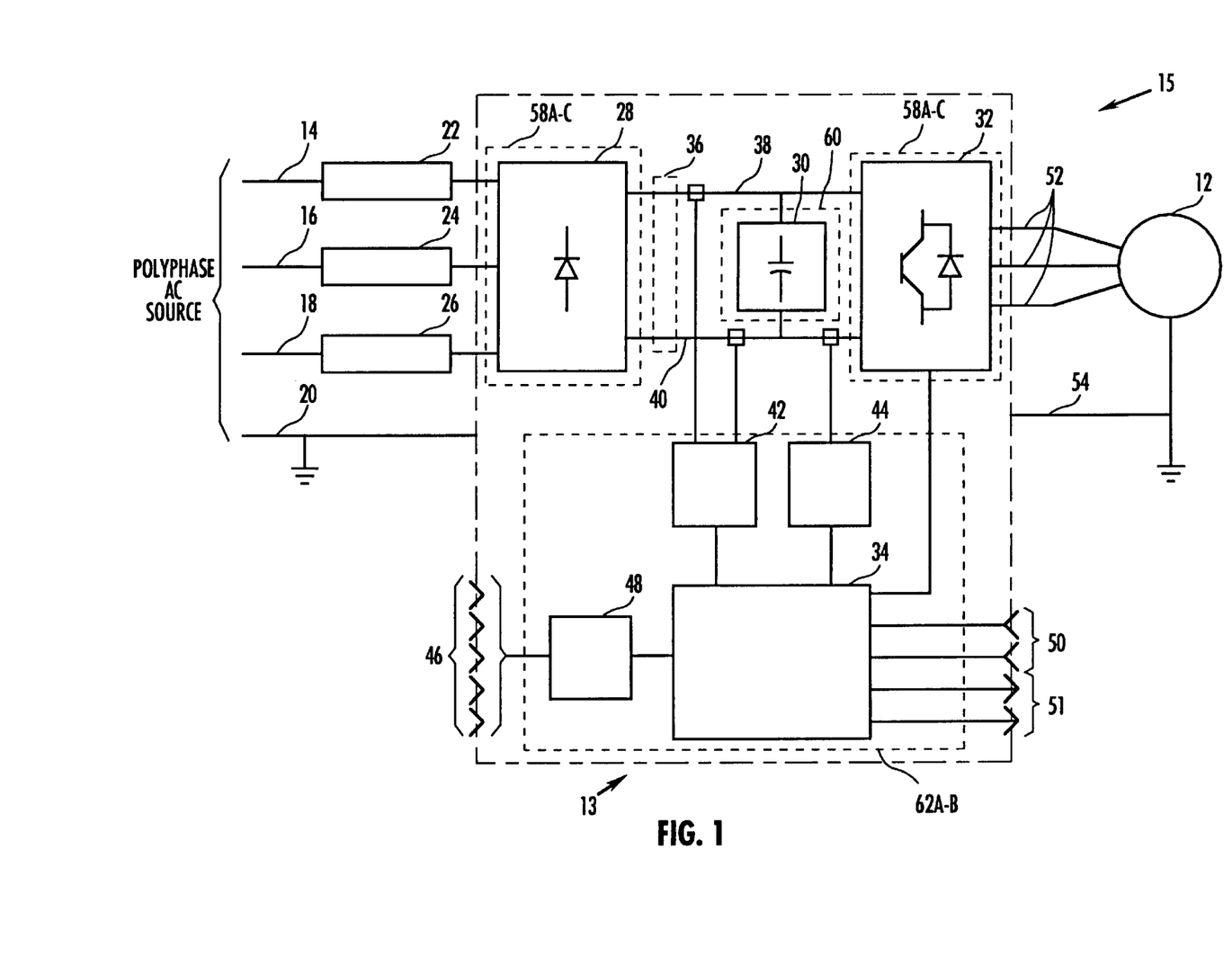
FIG. 1 is an electrical schematic block diagram of circuitry associated with a motor controller in accordance with a first exemplary embodiment of the circuit board system of the present invention.

Control system 13 includes a number of interconnected circuits, preferably configured within a unitary drive package. As illustrated in FIG. 1, system 13 includes a rectifying circuit 28, a capacitive circuit 30, a signal converting circuit 32 and a control circuit 34 employed on a circuit board system 15. Circuit board system 15 (FIGS. 1 and 2) includes power module circuit boards 58A–C, capacitor circuit board 60, and logic, customer interface, or mother circuit boards 62A–B. Rectifying circuit 28, capacitive circuit 30 and signal converting circuit 32 may be of types generally known in the art, such as the circuits incorporated in the Bulletin 1305 motor drives available from the Allen-Bradley Company of Milwaukee, Wis.

Figure 2:
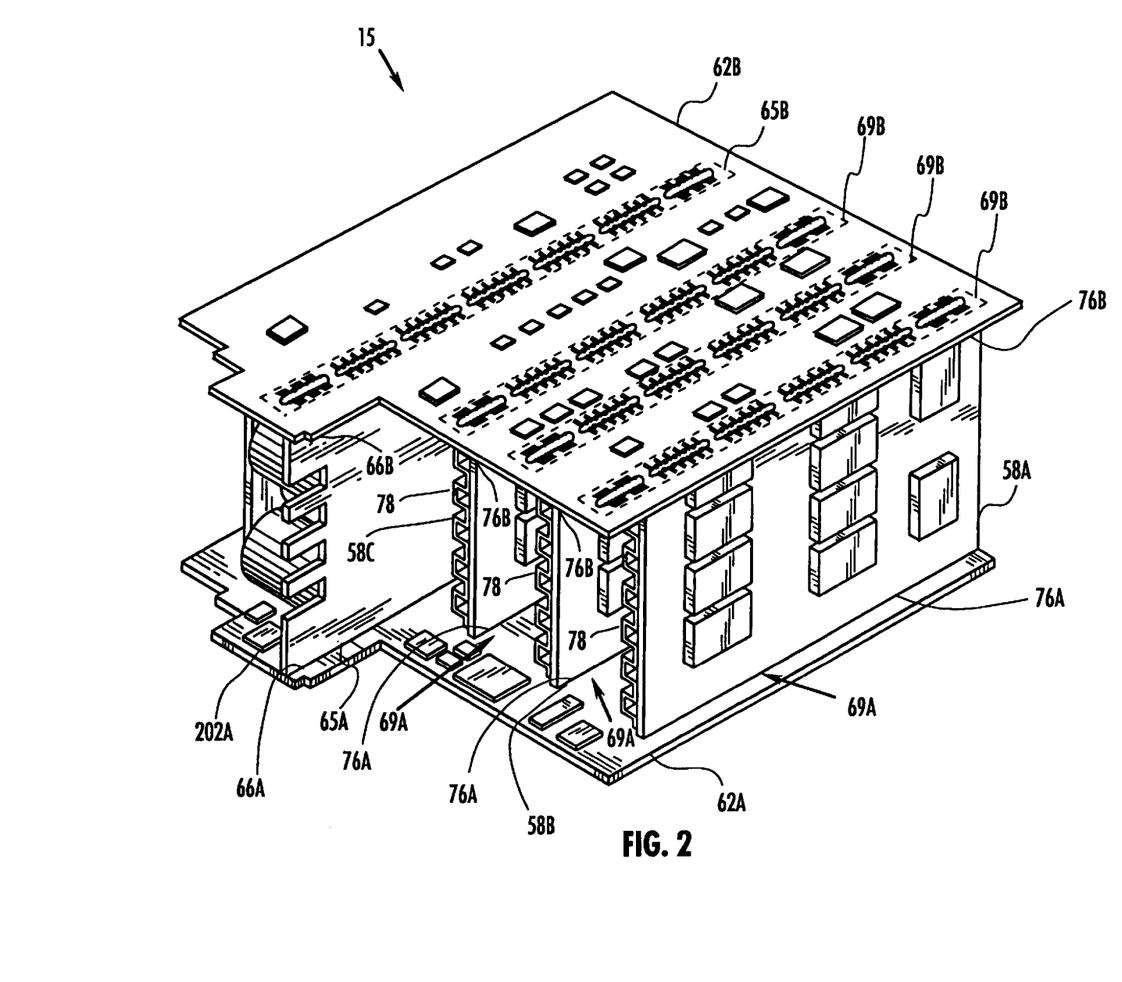
FIG. 2 is a perspective view schematic drawing of the circuit board system including the circuitry illustrated in FIG. 1 in accordance with the first exemplary embodiment of the circuit board system of the present invention.

Rectifying circuit 28 and signal converting circuit 32 are located on power module circuit boards 58A–C (see FIG. 2). Capacitive circuit 30 is located on capacitor circuit board 60, and circuits 34, 42, 44 and 48 are located on mother circuit boards 62A–B.

In the present embodiment of control system 13, control circuit 34 can be a microprocessor (digital processor) based circuit that includes an analog-to-digital converter (not shown) as a circuit which is integral to the microprocessor. Control circuit 34 can also include memory circuits (not shown), such as RAM and ROM (e.g. EPROM), that may be internal or external to the microprocessor. Programming that controls the microprocessor is stored in ROM, while the microprocessor utilizes RAM to temporarily store variable data which is utilized during the execution of the programs stored in ROM. The analog-to-digital converter converts analog signals (e.g. parameter signals) received by control circuit 34, as discussed below, to digital data representative of these signals. Accordingly, the analog-to-digital converter produces real-time digital data at a predetermined sampling interval which is representative of parameter signals communicated to control circuit 34.

Rectifying circuit 28 is coupled to incoming phase conductors 14, 16, 18 and includes circuitry for converting alternating current power from the incoming phase conductors to direct current power. Rectifying circuit 28 thus acts as a direct current source within control system 13, supplying DC power to signal converting circuit 32 via a DC converter bus 36. DC converter bus 36 is coupled to a positive bus and a negative bus or circuit input lines 38 and 40. Signal converting circuit 32 receives DC power from lines 38 and 40 (e.g., a DC bus) and includes circuitry, preferably including solid state switching elements (not shown in FIG. 1), for generating pulsed power signals at desired, variable frequencies for driving motor 12.

A bus voltage monitoring circuit 42 is coupled across lines 38 and 40 and includes circuitry for measuring the DC voltage difference between lines 38 and 40 and for producing a signal, representative of the DC bus voltage. Voltage monitoring circuit 42 is, in turn, coupled to control circuit 34 and provides the DC bus voltage signal to control circuit 34 for control of motor 12 as described below. A bus voltage current monitoring circuit 44 is also coupled to DC bus 36 and includes circuitry for measuring the current flowing through DC bus 36 and producing a signal representative thereof, which is in turn applied to control circuit 34.

In addition to inputs from voltage and current monitoring circuits 42 and 44, control circuit 34 is generally coupled to a number of input channels 46. Channels 46 may receive incoming signals from such external elements as start and stop circuits, reverse and jog switches and the like, typically arranged in a control terminal block (not shown). Such inputs are communicated to control circuit 34, preferably through an opto-isolating circuit 48 for protecting control circuit 34 from power surges. Moreover, control circuit 34 receives input signals through one or more ports 50. One such port 50 is generally coupled to a command input device, such as a potentiometer (not shown), for generating and supplying control circuit 34 with a target or desired output speed or frequency level. Other ports 50 may be provided for various programming and control interface devices, such as a hand-held human interface module (not shown) or a digital computer data link. One or more output or monitoring ports 51 are preferably linked to control circuit 34, along with appropriate analog circuitry, for selectively monitoring the various operating parameters of system 13, such as the desired and actual frequency or speed outputs.

Control circuit 34 is coupled to signal converting circuit 32 both for receiving signals from circuit 32 and for communicating control signals, to circuit 32 to drive motor 12. In response to the control signals, signal converting circuit 32 generates pulsed drive signals that are applied to motor 12 via output lines or conductors 52. Motor 12 is also coupled to control system 13 via a ground conductor 54. Signal converting circuit 32 includes circuitry (not shown) for monitoring the output current of the drive signals applied to motor 12 through each phase conductor 52 and for generating current signals. These current signals are communicated to control circuit 34 as feedback for control of motor 12. In addition to the output current signals, signal converting circuit 32 may include circuitry (not shown) for detecting and monitoring other operating parameters of motor 12 or control system 13, such as temperature.

Control circuit 34, voltage monitoring circuit 42, current monitor circuit 44, control circuit 34, and opto-isolating circuit 48 are preferably mounted on interface, logic or mother circuit boards 62A–B. Rectifying circuit 28 and signal converting circuit 32 are mounted on at least one (preferably three) power substrate circuit board 58A–C (FIG. 2). Capacitive circuit 30 is mounted on capacitor circuit board 60. Preferably, rectifying circuit 28 and signal converting circuit 32 may be divided into three separate circuits for each phase of input power and of motor 12. Each of the three circuits 28 and 32 can be mounted on a separate power substrate circuit board of boards 58A–C. Alternatively, capacitive circuit 30, rectifying circuit 28, and signal converting circuit 32 may be mounted on a single circuit board. Additionally, more circuit boards such as boards 58A–C, 60, and 62A–B may be utilized to house the described circuitry as well as different or additional circuitry.

With reference to FIG. 2, mother circuit boards 62A–B are conventional multi-layer circuit boards which houses three power module circuit boards 58A–C and capacitor circuit board 60 in a perpendicular fashion. Capacitor circuit board 60 is mounted in a mounting feature, area or region 65A of board 62A, and in a mounting region 65B of board 62B. Circuit boards 58A–C are mounted in mounting features, areas or regions 69A of board 62A and mounting regions 69B of board 62B. Mounting regions 65A–B and 69A–B are discussed in more detail below with reference to FIGS. 3–4.

Figure 5:
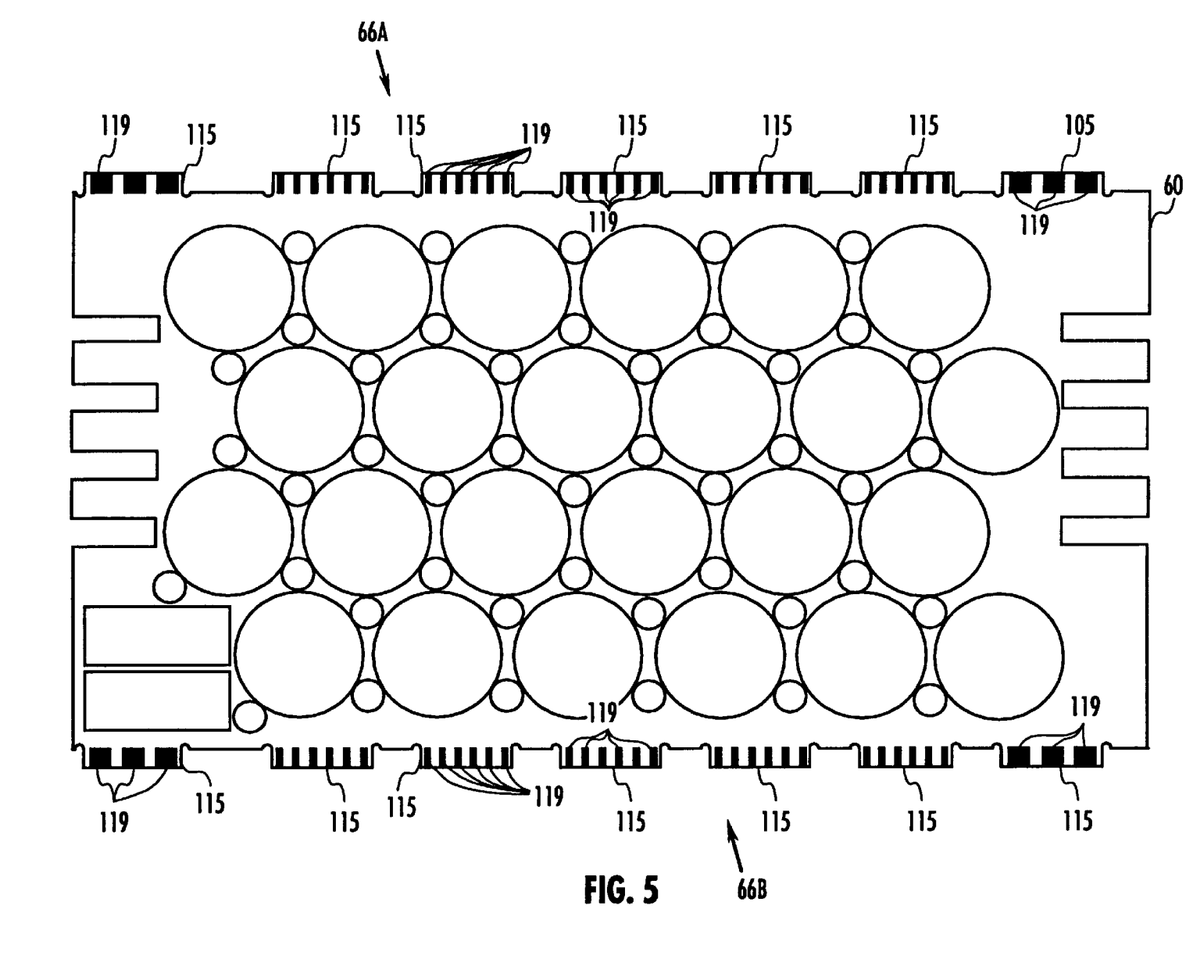
FIG. 5 is a top view of the power module circuit board illustrated in FIG. 2.
Figure 6:
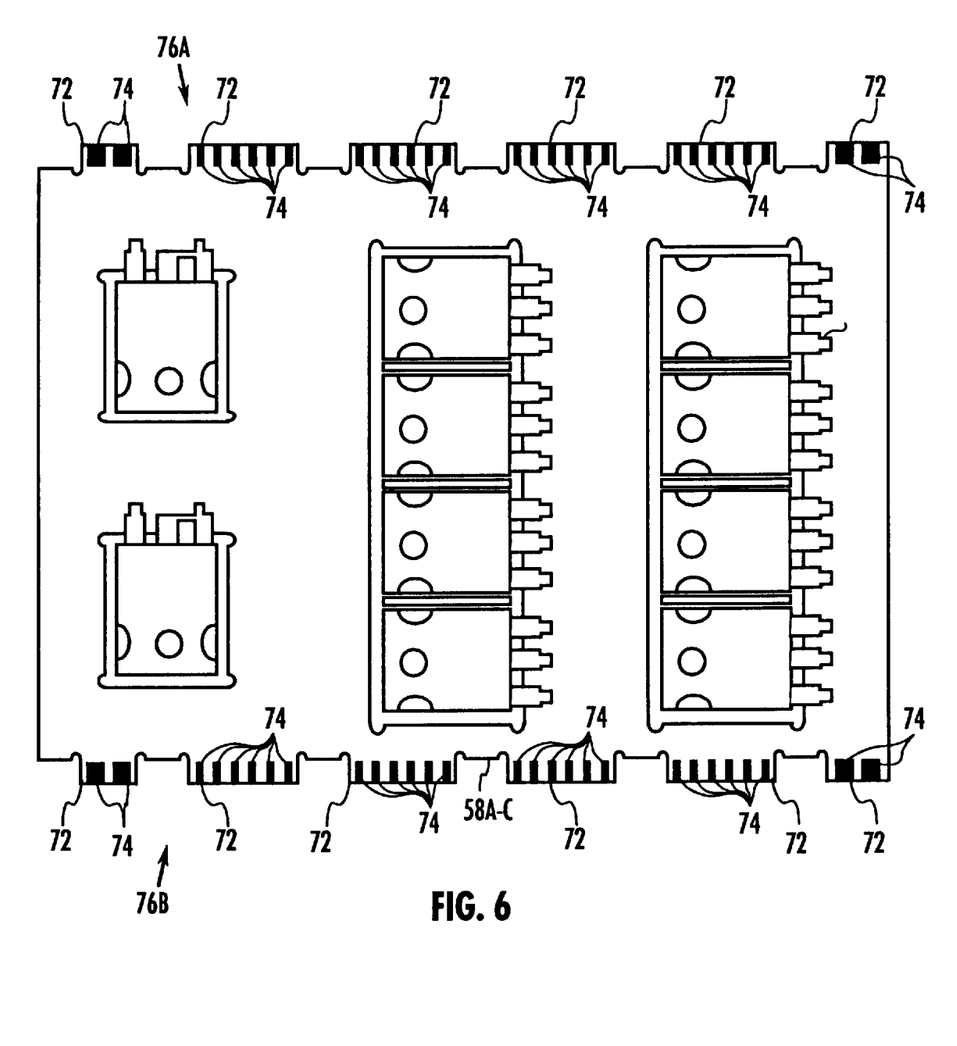
FIG. 6 is a top view of the capacitor circuit board illustrated in FIG. 2.

Capacitor circuit board 60 has mounting legs 115 (FIG. 5) including finger connectors 119 on a mounting edge 66A and a mounting edge 66B. Circuit boards 58A–C also include mounting legs 72 (FIG. 6) having finger connectors 74 on a mounting edge 76A and a mounting edge 76B. Boards 58A–C and board 60 are similar to the boards disclosed in U.S. application Ser. Nos. 08/527,120, now U.S. Pat. No. 5,754,411, and 08/536,224 except that mounting legs 72 and 115 are located on at least two edges of each of boards 58A–C and board 60.

Mother circuit boards 62A–B and mounting regions 65A–B and 69A–B are similar to the mother boards and the mounting regions or trenches disclosed in U.S. application Ser. Nos. 08/527,120 and 08/536,244, now U.S. Pat. No. 5,648,892. Mother circuit boards 62A–B can be manufactured from conventional circuit board materials or circuit board materials having enhanced dielectric characteristics to increase the capacitance associated with boards 62A–B.

Preferably, heat sinks 78 are disposed on circuit boards 58A–C in a parallel fashion with other circuit boards 58A–C. Heat sinks 78 can be conventional heat sinks or automotive radiator coils soldered to boards 58A–C. The orientation of circuit boards 58A–C, and 60 and heat sinks 78 provides optimum heat transfer from system 15. A fan (not shown) may be employed to blow air in parallel with boards 58A–C and heat sinks 78.

Figure 3:
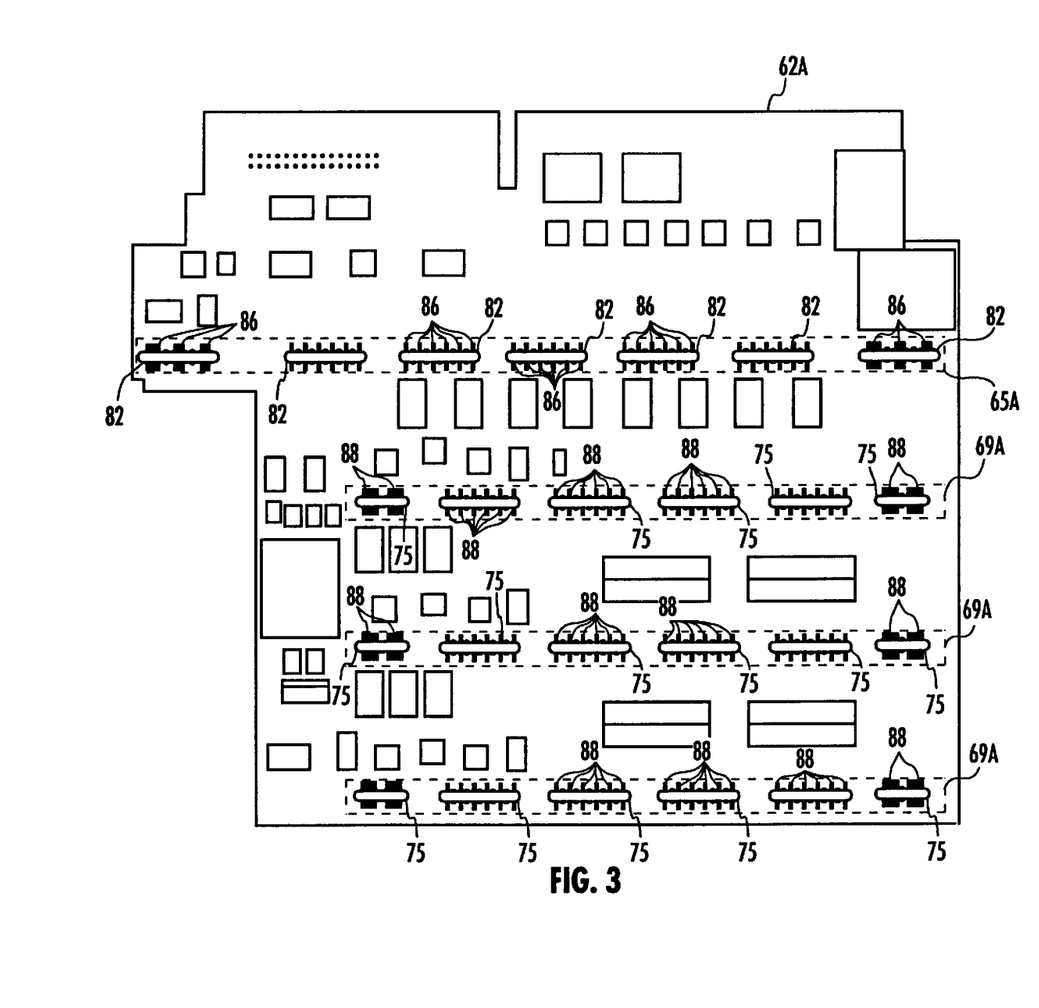
FIG. 3 is a top view schematic drawing of the first motherboard illustrated in FIG. 2.
Figure 4:
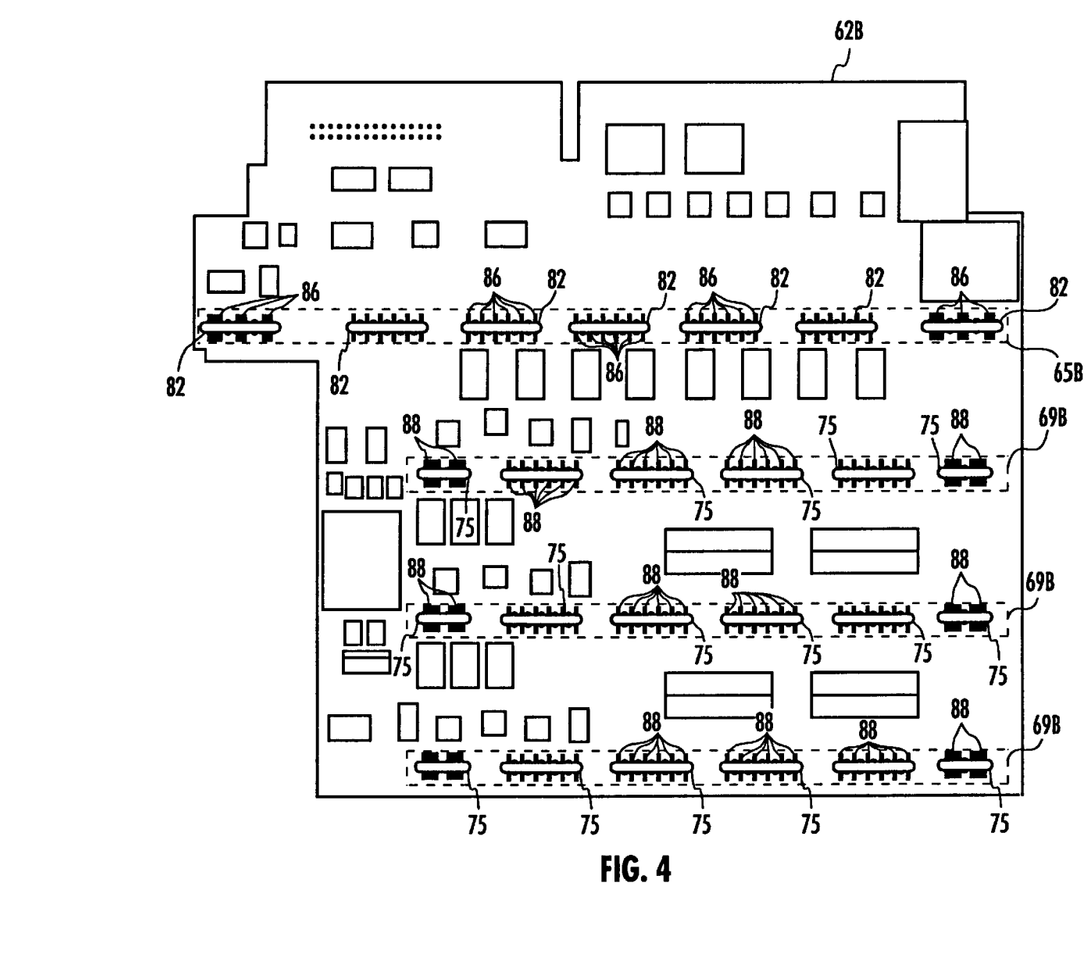
FIG. 4 is a bottom view schematic drawing of the second motherboard illustrated in FIG. 2.

In FIGS. 3 and 4, mounting regions 65A–B include trenches, slots or apertures 82 which have finger connectors 86 for receiving control, power and logic signals. Alternatively, a slot or window (not shown) can extend the length of regions 65A–B. The slot or window can include apertures such as apertures 82. Connectors 86 can receive power signals such as signals from lines 38 and 40 (FIG. 1) and bus 36 from boards 58A–C or board 60. Finger connectors 86 can be plated within apertures 82 for stable mechanical and electrical connection to finger connectors 119 on mounting legs 115 of mounting edges 66A–B of board 60.

Mother circuit boards 62A–B also include mounting features, areas, or regions 69A–B for receiving circuit boards 58A–C. Mounting regions 69A–B include six slots, trenches, or apertures 75 having finger connectors 88 to receive control, power, and logic signals. Alternatively, a slot or window (not shown) can extend the length of regions 69A–B. The slot or window can include apertures such as apertures 82. Finger connectors 88 can receive power signals such as lines 38 and 40 (FIG. 1) and bus 36 from boards 58A–C or capacitor board 60. Finger connectors 88 can be plated within apertures 75 for stable mechanical and electrical connection to finger connectors 74 on mounting legs 72 of mounting edges 76A–B of boards 58A–C.

Mounting regions 65A–B and 69A–B advantageously include hemi-cylinders (not shown) associated with finger connectors 86 and 88. Preferably, the hemi-cylinders provide a plated-through connector within apertures 75 and 82. System 15 advantageously transfers the stresses on boards 58A–C and 60 into mother circuit boards 62A–B without weakening the coupling between boards 58A–C and 60 and boards 62A–B (e.g., the solder or epoxy joints associated with mounting regions 65A–B and 69A–B). System 15 utilizes the inherent strength associated with boards 62A–B to provide a stable mounting boards 58A–C and 60. Mounting regions 65A–B and 69A–B can be designed to provide a size-on-size fit, interference fit, or strain relief fit with mounting edges 65A–B and 76A–B.

Figure 7:
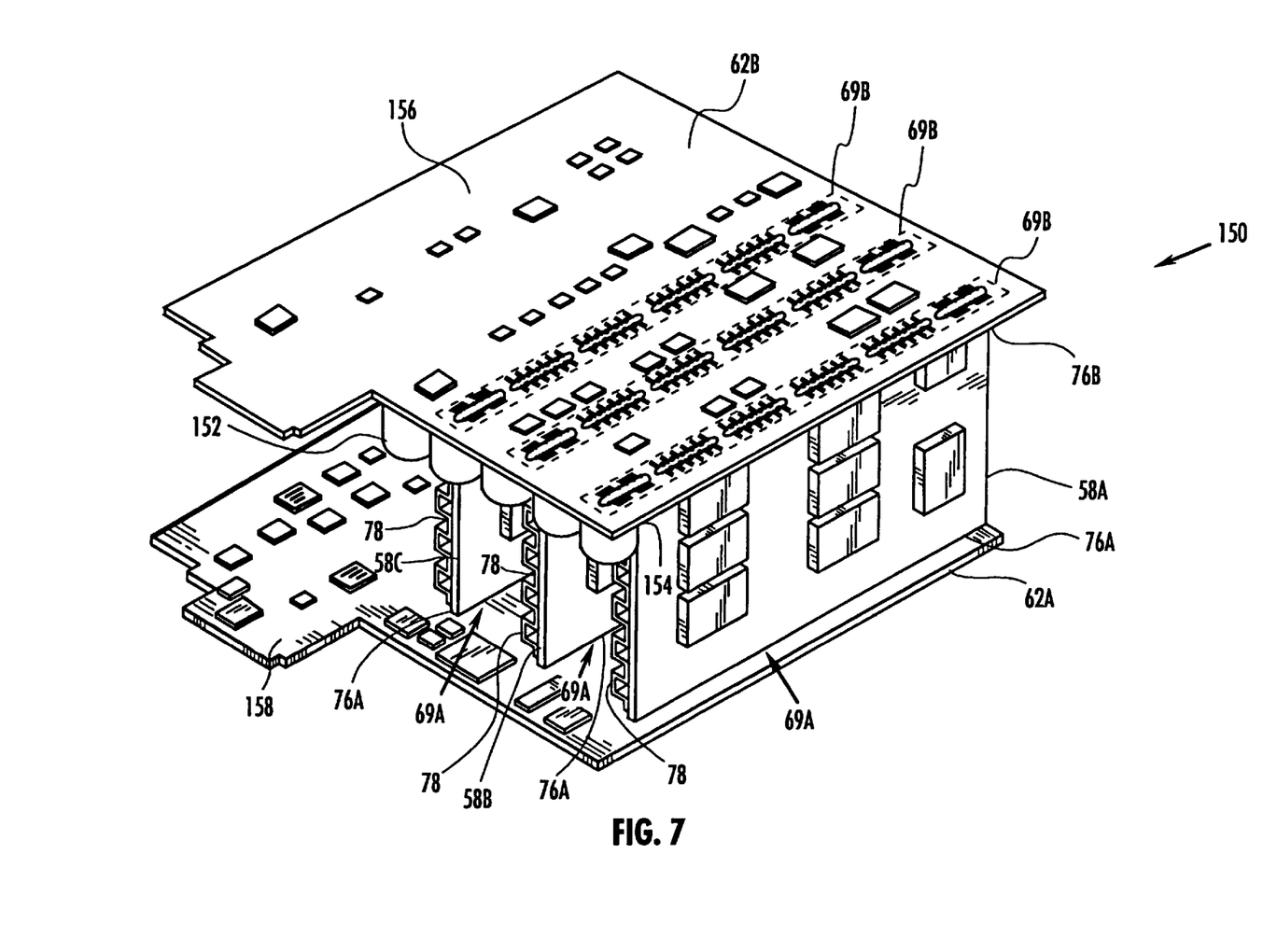
FIG. 7 is a perspective view schematic drawing of a circuit board system having capacitors mounted on a motherboard in accordance with a second exemplary embodiment of the circuit board system of the present invention.

With reference to FIG. 7, an advantageous circuit board system 150 is substantially similar to circuit board system 15 shown in FIG. 2. However, system 150 includes a mother circuit board 62B which includes capacitors 152, thereby eliminating the need for board 60 discussed with reference to FIGS. 1–6. Capacitors 152 are located on a surface 154 of mother circuit board 62B. Alternatively, capacitors 152 may be located on a surface 158 of board 62A or a surface 156 of board 62B. Boards 58A–C can be enlarged in length or height so that capacitor 152 do not interfere with the placements of heat sinks 78 on boards 58A–C. Alternatively, capacitors 152 can be positioned in between boards 58A–C if boards 58A–C are spaced apart to provide sufficient room for heat sinks 78. In yet another alternative, mother circuit board 62B could be lengthened in a dimension parallel to boards 58A–C, and capacitors 152 could be disposed in front of or behind boards 58A–C.

Figure 8:
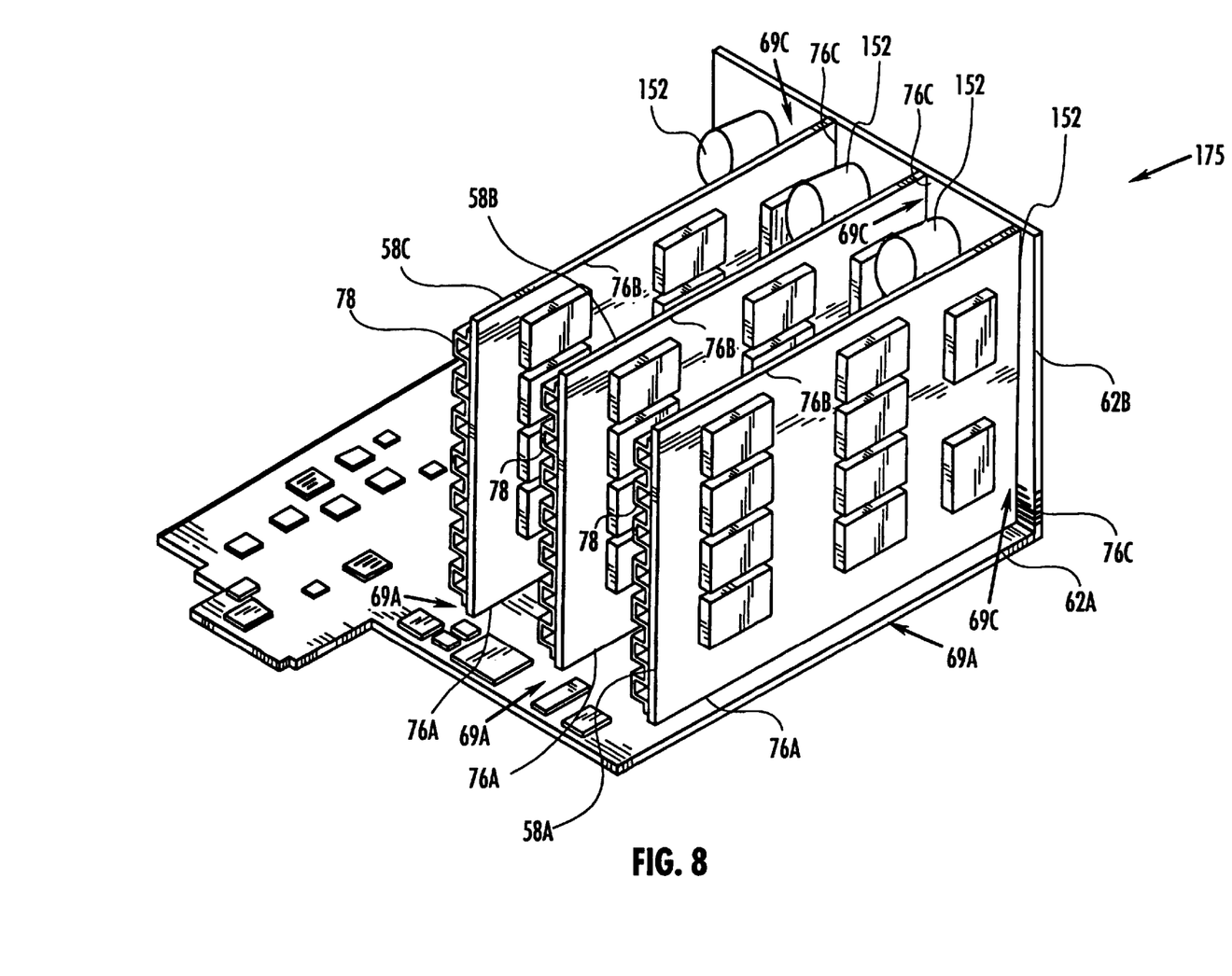
FIG. 8 is a perspective view schematic drawing of a circuit board system having a side-mounted motherboard in accordance with a third exemplary embodiment of the circuit board system of the present invention.

With reference to FIG. 8, a circuit board system 175 is substantially similar to the circuit board systems 15 and 150 described with reference to FIGS. 2 and 7. However, mother circuit board 62C is coupled to a mounting edge 76C on circuit boards 58A–C. Board 62C can include large venting holes (not shown) to assist the heat dissipating from boards 58A–C and heat sinks 78. Additionally, capacitors 152 can be disposed on board 62A or 62C, thereby eliminating the need for a capacitor board 60 (FIG. 2).

Figure 9:
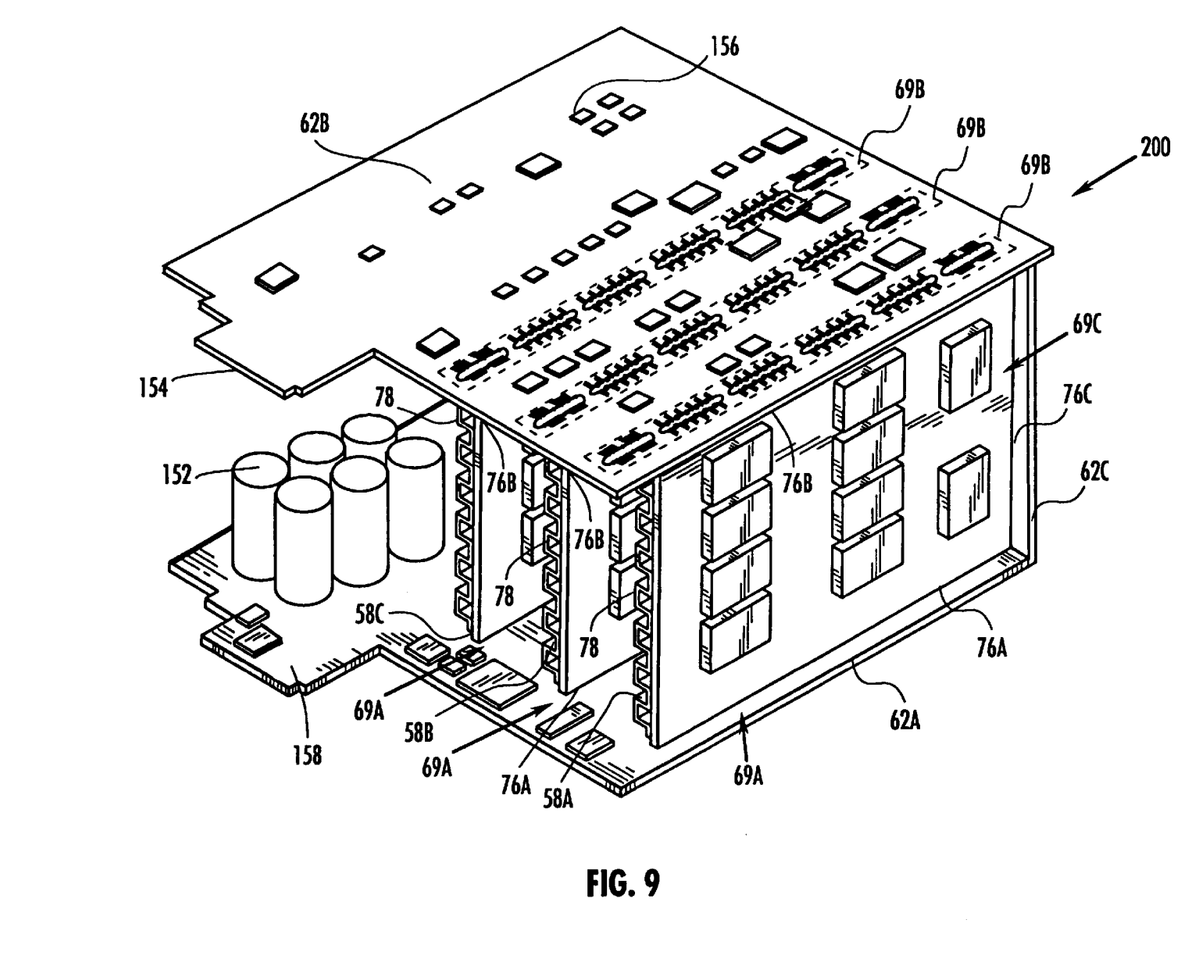
FIG. 9 is a perspective view schematic drawing of a circuit board system including three motherboards in accordance with a fourth exemplary embodiment of the circuit board system of the present invention.

With reference to FIG. 9, a circuit board system 200 is substantially similar to the circuit board system 150 described with reference to FIG. 7. However, circuit board system 200 includes mother circuit board 62C attached to mounting edge 76C and mother circuit board 62B attached to mounting edge 76B on boards 58A–C. Alternatively, a fourth mother circuit board (not shown) may be attached to a mounting edge 76D of boards 58A–C.

With reference to FIGS. 1–9, systems 15, 150, 175 and 200 provide a rigid structure for circuit board modules 58A–C, and capacitive board 60, and mother circuit boards 62A–C. The structural interaction of boards 58A–C, 60, and 62A–C due to the use of two or more mother circuit boards 62A–C provides superior strength for systems 15, 150, 175 and 200. The inherent strength associated with systems 15, 150, 175 and 200 allows a light weight housing or other container to be utilized to protect systems 15, 150, 175 and 200 without the use of brackets or other support members.

Additionally, the use of more than one mother circuit board 62A–C provides increased space for designing busses such as lines 38 and 40 and bus 36 in a motor controller application without a significant increase in volume or heat containment for systems 15, 150, 175 and 200. Such increased space, allows lines 38 and 40 and converter bus 36 (FIG. 1) to have a maximum width and an increased capacitance, thereby eliminating the need for snubber circuits or other devices to reduce the parasitic inductive effects. Additionally, systems 15, 150, 175, and 200 are shown as a wireless motor controller-advantageously having no external wire connections between boards 60, 62A–C and 58A–C. The housing (not shown) for systems 15, 150, 175 and 200 can simply be a facade or covering which serves to insulate systems 15, 150, 175 and 200 from an external environment. Mother circuit boards 62A–C can be constructed from a circuit board having an enhanced dielectric to increase the inherent capacitance of mother circuit board 62A–C, thereby reducing parasitic inductance associated with systems 15, 150, 175, and 200.

Additionally, although systems 15, 150, 175 and 200 have been described with mother circuit boards 62A–C supporting modules 58A–C and capacitor board 60, other configurations may be utilized. The circuitry on the various circuit boards are not shown in a limiting sense. For example, inverter circuits, capacitive circuits, switching circuits or other electronic devices may be located on any of boards 58A–C, 60, 62A–C.

It should be noted that the foregoing construction of systems 15, 150, 175, and 200 including mother circuit boards 62A–C allows for relatively large, parallel planes of conductive material defining busses or lines 38 and 40 and bus 36. Unlike known power substrates, wherein DC busses are typically defined as surface traces on a substrate material and coupled to the power components by wire bonding techniques, the arrangement of lines 38 and 40 and bus 36 on boards 62A–C provides a large area for canceling or reducing parasitic inductance during switching phases of the inverter circuitry. The inventors have found that voltage spikes during turnoff phases of operation of the motor controller may thus be virtually eliminated without recourse to snubbing circuitry or the like. It should also be noted that the preferred structure described above provides considerably enhanced thermal properties heretofore unavailable in system 15, 150, 175, and 200.

It is understood that, while the detailed drawings, specific examples and particular materials given describe preferred exemplary embodiments of the present invention, they are for the purpose of illustration only. The invention is not limited to the precise details and conditions disclosed. For example, although particular applications, electrical devices, and circuit board layers are described, the circuit board system may be populated with other types of heat producing components or comprised of different materials. Also, various configurations for a heat sink conducting area may be utilized. Further still, various shapes, sizes, and materials for the copper slugs may be utilized. Moreover, while the particular circuits are shown mounted on mother circuit boards, the term "mother circuit board" is only used in the mechanical sense. Other types of circuits may be housed on the motherboard, including connector circuits, capacitive circuits, switching circuits and other application circuitry. The term "mother circuit board" as used herein describes the mechanical relation between boards 62A–C and other circuit boards. Further still, while the power substrate module described above provides rectifying and inverting circuitry for a single phase, modules employing the same construction may be built for three phase rectification and inversion on a single board. Similarly, although the structure described above employs three module circuit boards in parallel to accomplish the desired inverting function, systems 15, 150, 175, and 200 in accordance with the invention may be built with more or fewer circuit board modules. Various changes can be made to the details disclosed without departing from the spirit of the invention which is defined by the following claims.

What is claimed is:

1. A wireless motor controller, comprising;
   a power circuit board including power semiconductor switches and a heat sink member attached to the power circuit board;
   a capacitor module including a positive bus, a negative bus and a plurality of storage capacitors, the plurality of storage capacitors being coupled between the positive bus and the negative bus;
   a first mounting board having a first conductive pattern; and
   a second mounting board having a second conductive pattern;
   wherein the first and second mounting boards each are mechanically and electrically coupled to the power circuit board and the capacitor module, the positive bus and the negative bus in the capacitor module being electrically coupled to the power circuit board solely via a connection of at least one of the first and second conductive patterns, whereby parasitic inductive effects are reduced as compared with a connection arrangement in a conventional motor controller system.

2. The wireless motor controller as recited in claim 1, wherein the power circuit board includes a first mounting edge and the first mounting board includes a first trench to receive the first mounting edge, the first trench having a lateral face with a plated connector, the plated connector being part of the first conductive pattern.

3. The wireless motor controller as recited in claim 2, wherein the power circuit board includes a plurality of mounting legs, and the first mounting board includes at least one aperture therethrough, the aperture being configured to receive at least one of the mounting legs.

4. The wireless motor controller as recited in claim 2, wherein the power circuit board includes a second mounting edge and the second mounting board includes a second trench to receive the second mounting edge of the power circuit board, the second trench having a lateral face with a plated connector, the plated connector being part of the second conductive pattern.

5. The wireless motor controller as recited in claim 4, wherein the first mounting edge is generally parallel to the second mounting edge.

6. The wireless motor controller as recited in claim 4, wherein the first mounting edge is generally perpendicular to the second mounting edge.

7. The wireless motor controller as recited in claim 1, wherein the capacitor module is situated on the first mounting board.

8. The wireless motor controller as recited in claim 1, further comprising a capacitor circuit board, wherein the capacitor module is situated on the capacitor circuit board.

9. A motor controller circuit board system, comprising:
   a plurality of power substrates, each power substrate including a first mounting edge, a second mounting edge, and power semiconductor switches, and wherein a heat sink member is attached to each substrate, wherein when the power semiconductor switches process electrical power which generates heat in the power semiconductor switches, the heat sink member dissipates at least a portion of the heat;
   a capacitor module including a positive bus, a negative bus and a plurality of storage capacitors coupled between the positive bus and the negative bus;
   a first mounting board having a first conductive pattern; and
   a second mounting board having a second conductive pattern;
   wherein the first and second mounting boards each include a mounting surface having a mounting feature configured to receive at least a portion of one of the first and second mounting edges of each power substrate, each power substrate is electrically coupled to the first and second mounting boards solely via the first and second conductive patterns, and the positive bus and the negative bus are electrically coupled to each power substrate solely via at least one of the first and second conductive patterns.

10. The motor controller circuit board system as recited in claim 9, wherein each of the first and second mounting edges includes a plurality of legs, and each mounting surface includes an aperture therethrough configured to receive one of the legs.

11. The motor controller circuit board system as recited in claim 9, wherein each mounting surface includes a trench.

12. The motor controller circuit board system as recited in claim 9, wherein each mounting feature includes a lateral face having a plated portion, the plated portion being part of the first and second conductive patterns.

13. The motor controller circuit board system as recited in claim 9, wherein the first and second mounting boards are generally parallel to each other.

14. The motor controller circuit board system as recited in claim 9, wherein the capacitor module is situated on the first mounting board.

15. The motor controller circuit board system as recited in claim 9, wherein each of the mounting features includes a plurality of finger connectors.

16. The motor controller circuit board system as recited in claims 9, wherein the heat sink members are disposed on the power substrates in parallel with each other.

17. A wireless motor controller including a plurality of semiconductor switches and control circuitry which controls switching of the semiconductor switches when the wireless motor controller is operational, comprising:

a plurality of power substrates, each power substrate including a first mounting edge, a second mounting edge, and power semiconductor switches, and wherein a heat sink member is attached to each substrate, wherein when the power semiconductor switches process electrical power which generates heat in the power semiconductor switches, the heat sink member dissipates at least a portion of the heat;

a first mounting board having a first conductive pattern and including at least a portion of the control circuitry; and a second mounting board having a second conductive pattern;

wherein the first and second mounting boards each are mechanically and electrically coupled to the power substrate boards, the power substrate boards being electrically coupled to the first and second mounting boards solely via the first conductive pattern and the second conductive pattern, whereby, when the wireless motor controller is operational, the magnitude of voltage spikes generated by the switching of the semiconductor switches is reduced as compared with an electrical coupling arrangement including external wires or external connectors.

18. The wireless motor controller as recited in claim 17, wherein the first mounting board includes a first mounting feature to receive the power circuit board, the first mounting feature having a lateral face with a plated connector, the plated connector being part of the first conductive pattern.

19. The wireless motor controller as recited in claim 17, wherein each of the power substrate includes a plurality of mounting legs and the first mounting board includes at least one aperture therethrough, the first aperture being configured to receive at least one of the mounting legs.

20. The wireless motor controller as recited in claim 17, wherein each of the power substrates includes a first mounting edge and a second mounting edge, the first mounting edge being generally perpendicular to the second mounting edge, and wherein the first and second mounting boards are mechanically and electrically coupled to the first and second mounting edges, respectively.

21. The wireless motor controller as recited in claim 17, further comprising a capacitor module including a positive bus, a negative bus, and a plurality of storage capacitors coupled between the positive bus and the negative bus, wherein the positive bus and the negative bus are electrically coupled to the power substrates solely via at least one of the first conductive pattern and the second conductive pattern.

22. The wireless motor controller as recited in claim 21, further comprising a capacitor circuit board, wherein the plurality of storage capacitors, the positive bus and the negative bus are situated on the capacitor circuit board.

* * * * *